United States Patent [19]

Kaga

[11] Patent Number: 5,576,542
[45] Date of Patent: Nov. 19, 1996

[54] SUBSTRATE CROSS-SECTION OBSERVING APPARATUS

[75] Inventor: Yasuhiro Kaga, Yokohama, Japan

[73] Assignee: Kabushiki Kaisha Toshiba, Kawasaki, Japan

[21] Appl. No.: 352,223

[22] Filed: Dec. 8, 1994

[30] Foreign Application Priority Data

Dec. 8, 1993 [JP] Japan .................................. 5-308014

[51] Int. Cl.$^6$ ................................................... H01J 37/26
[52] U.S. Cl. ........................... 250/310; 250/307; 250/309
[58] Field of Search ..................................... 250/307, 310, 250/309

[56] References Cited

U.S. PATENT DOCUMENTS

| | | | |
|---|---|---|---|
| 4,725,730 | 2/1988 | Kato et al. | 250/307 |
| 4,910,398 | 3/1990 | Komatsu et al. | 250/307 |
| 5,029,250 | 7/1991 | Komatsu | 250/310 |
| 5,093,572 | 3/1992 | Hosono | 250/310 |
| 5,161,201 | 11/1992 | Kaga et al. | 382/8 |
| 5,179,280 | 1/1993 | Wang | 250/307 |
| 5,412,210 | 5/1995 | Todokoro et al. | 250/310 |

FOREIGN PATENT DOCUMENTS

2-123749  5/1990  Japan .
2-152155  6/1990  Japan .

*Primary Examiner*—Bruce C. Anderson
*Attorney, Agent, or Firm*—Oblon, Spivak, McClelland, Maier & Neustadt, P.C.

[57] ABSTRACT

Even if an observing charged beam is irradiated upon an observation cross section obliquely from above, it is possible to obtain an observation image equivalent to that obtained when the observing charged beam is irradiated thereupon vertically from above. A wafer to be observed is mounted on the stage. The stage is moved by the stage control section on the basis of coordinate data given by the coordinate inputting section to such a position that an observed position of the wafer can be located just under the ion beam irradiating unit. The ion beam of the ion beam irradiating unit is irradiated upon the wafer surface vertically to form an observation cross section. On the other hand, an electron beam is irradiated from the electron beam irradiating unit upon the observation cross section obliquely from above at an inclination angle with respect to the ion beam irradiating unit. The secondary electrons emitted from the wafer surface are detected by the detector to generate video signals. These video signals are corrected on the basis of the inclination angle, and then converted into image signals equivalent to those obtained when the observation cross section is observed in the vertical direction from above.

6 Claims, 8 Drawing Sheets

SUBSTRATE CROSS-SECTION OBSERVING APPARATUS

BACKGROUND OF THE INVENTION

1. Field of the Invention

The present invention relates to a substrate cross-section observing apparatus, and more specifically to an apparatus for observing a microminiature cross section of a semiconductor substrate such as a wafer (on which a micro-miniaturized pattern is formed) with the use of a charged beam.

2. Description of the Prior Art

When a cross section of a wafer on which a microminiaturized pattern is formed is required to be observed, the wafer is cut off by use of a diamond cutter, for instance and then the wafer is broken off along the scar to expose the cross section, so that the worker can observe the exposed cross section of the wafer. Further, after the exposed observation cross section has been processed so as to be suitable for electron microscope observation, the processed observation cross section of the wafer is to be observed.

In the conventional method of forming the observation cross section, the microminiaturized pattern portion to be observed is first selected by visual inspection or work and then must be cut off along the selected cross section by use of the diamond cutter. Or else, the microminiaturized pattern portion to be observed is cut off by use of the diamond cutter, without any selection, so that the cut off surface may pass through a great number of the microminiaturized patterns. Accordingly, a great deal of skill has been so far required for the work for forming the observation cross section. In addition, where the observed pattern is separated alone or where the observation positions have been already determined, it is extremely difficult or rather impossible to accurately cut off the determined observation positions by use of a diamond cutter.

To overcome these problems, various apparatus of observing wafer cross sections have been so far developed. As one of the examples of these wafer cross section observing apparatus, there exists such an apparatus that: any required microminiaturized pattern portion is irradiated with an etching ion beam to form a bore of about several μm in the vertical direction in the surface of the wafer, and the vertical wall surface of this formed vertical bore is irradiated with an observing ion or electron beam obliquely from above for electron microscope observation.

In the above-mentioned prior art wafer cross section observing apparatus, however, since the observing ion or electron beam is irradiated upon the observation cross section obliquely from above, there exists such a problem in that it is impossible to check the vertical dimension of the observation cross section intuitively.

To overcome this problem, there exists such a method of increasing the diameter of the bore for observation and further of irradiating the observing ion or electron beam upon the observation cross section roughly in the vertical direction. In this method, however, since a long etching time is required to form a large diameter bore for observation, which raises another problem in that the observing efficiency is inevitably lowered.

SUMMARY OF THE INVENTION

With these problems in mind, therefore, it is the object of the present invention to provide a substrate cross section observing apparatus, by which an observation image equivalent to that obtained when the observing charged beam is irradiated upon the observation surface in roughly the vertical direction of the observation surface, in spite of the fact that the observing charged beam is irradiated upon the observation surface obliquely from above.

To achieve the above-mentioned object, the present invention provides a substrate cross section observing apparatus, comprising: stage means for mounting a substrate to be observed; the first charged beam irradiating means for irradiating a processing charged beam at roughly a right angle upon a surface of the substrate, to form an almost vertical observation surface therein; the second charged beam irradiating means disposed being inclined relative to said charged beam irradiating means, for irradiating an observing charged beam at a predetermined inclination angle upon the formed observation surface of the substrate; detecting means for detecting secondary electrons generated by the irradiation of the observing charged beam, and for generating video signals; inclination angle signal generating means for generating an inclination angle signal indicative of the predetermined inclination angle; image processing means for correcting the image signals generated by said detecting means on the basis of the inclination angle signal generated by said inclination angle signal generating means; and display means for displaying an image of the observation surface on the basis of the corrected image signals.

The substrate cross section observing apparatus further comprises: coordinate inputting means for inputting two dimensional coordinates of said stage means; and stage control means for moving said stage means to a processing charged beam irradiating position and an observing charged beam irradiation position, respectively on the basis of the two dimensional position coordinates.

Further, the present invention provides a substrate cross section observing apparatus, comprising: stage means for mounting a substrate to be observed; the first charged beam irradiating means for irradiating a processing charged beam at roughly a right angle upon a surface of the substrate to form an almost vertical observation surface therein and further, after the observation surface has been formed, for irradiating an observing charged beam at a predetermined inclination angle upon the formed observation surface of the substrate; detecting means for detecting secondary electrons generated by the irradiation of the observing charged beam, and for generating video signals; inclination angle signal generating means for generating an inclination angle signal indicative of the predetermined inclination angle; image processing means for correcting the image signals generated by said detecting means on the basis of the inclination angle signal generated by said inclination angle signal generating means; display means for displaying an image of the observation surface on the basis of the corrected image signals; and wherein the inclination angle of said stage means is changed between the processing charged beam irradiation and the observing charged beam irradiation.

Further, the present invention provides a substrate cross section observing apparatus, comprising: inclinable stage means for mounting a substrate to be observed; the first charged beam irradiating means for irradiating a processing charged beam at roughly a right angle upon a surface of the substrate mounted on said inclinable stage means, to form an almost vertical observation surface therein; the second charged beam irradiating means, after the observation surface has been formed, for irradiating an observing charged beam at a predetermined inclination angle upon the surface of the formed observation surface; detecting means for detecting secondary electrons generated by the irradiation of the observing charged beam, and for generating video signals; inclination angle signal generating means for generating an inclination angle signal indicative of the predetermined inclination angle between the wafer surface and the observing charged beam; beam scanning control means for controlling a scanning speed or a scanning pitch of the observing charged beam on the basis of the inclination angle signal generated by said inclination angle signal generating means; and display means for displaying an image of the observation surface.

Further, the present invention provides a method of observing a substrate cross section, which comprises of the steps of: holding a wafer on a stage; irradiating a processing charged beam at roughly a right angle upon a surface of the wafer to form a vertical observation cross section in an observed portion of the wafer; inclining the stage at such an inclination angle that an observing charged beam can be irradiated upon the observation cross section; detecting an inclination angle signal indicative of an inclination angle between the wafer surface and the observing charged beam; generating a beam scanning signal for controlling a scanning speed or a scanning pitch of the observing charged beam on the basis of the detected inclination angle signal; irradiating an observing charged beam upon the observation cross section at a magnification-dependent scanning speed or pitch in the surface direction and at the beam scanning signal-dependent scanning speed or pitch in a surface depth direction; converting secondary electrons generated by the irradiation of the observing charged beam into image through a detector; and displaying the converted image on a display unit.

In the substrate cross section observing apparatus according to the present invention, the first charged irradiating means irradiates a processing charged beam upon the surface of a substrate mounted on the stage in the roughly vertical direction to form a roughly vertical observation surface. After that, the charged beam irradiating means irradiates the an observing charged beam upon the formed vertical observation surface at a predetermined inclination angle with respect to the vertical observation surface. The detecting means detects the secondary electrons emitted due to the irradiation of the observing charged beam and further generates the video signals. The image processing means corrects the video signals detected by the detecting means on the basis of the inclination angle generated by the inclination angle signal generating means. The display means displays an image of the vertical observation surface on the basis of the corrected video signals.

Further, in the substrate cross section observing apparatus according to the present invention, the charged beam irradiating means irradiates an observing electron beam upon the surface of the substrate mounted on the stage in roughly the vertical direction of the substrate to form a vertical observation surface. After that, an inclination angle of the stage is changed to change the inclination angle between the charged beam irradiating means and the substrate surface, and the charged beam irradiating means irradiates an observing charged beam upon the vertical observation surface of the substrate at a predetermined inclination angle with respect to the vertical observation surface. The detecting means detects the secondary electrons emitted due to the irradiation of the observing charged beam and further generates the video signals. The image processing means corrects the video signals detected by the detecting means on the basis of the inclination angle generated by the inclination angle signal generating means. The display means displays an image of the vertical observation surface on the basis of the corrected video signals.

As described above, in the substrate cross section observing apparatus according to the present invention, since the video signals obtained when the observing charged beam is irradiated upon the observation surface obliquely from above is corrected on the basis of the inclination signal, and further since the image of the observation surface can be displayed on the basis of the corrected video signals, it is possible to obtain the observation image equivalent to that obtained when the observing charged beam is irradiated upon the observation surface vertically from above, in spite of the fact that the observing charged beam is actually irradiated upon the observation surface obliquely from above.

DETAILED DESCRIPTION OF THE PREFERRED EMBODIMENTS

Embodiments of the substrate cross section observing apparatus according to the present invention will be described hereinbelow with reference to the attached drawings.

Figure 1:
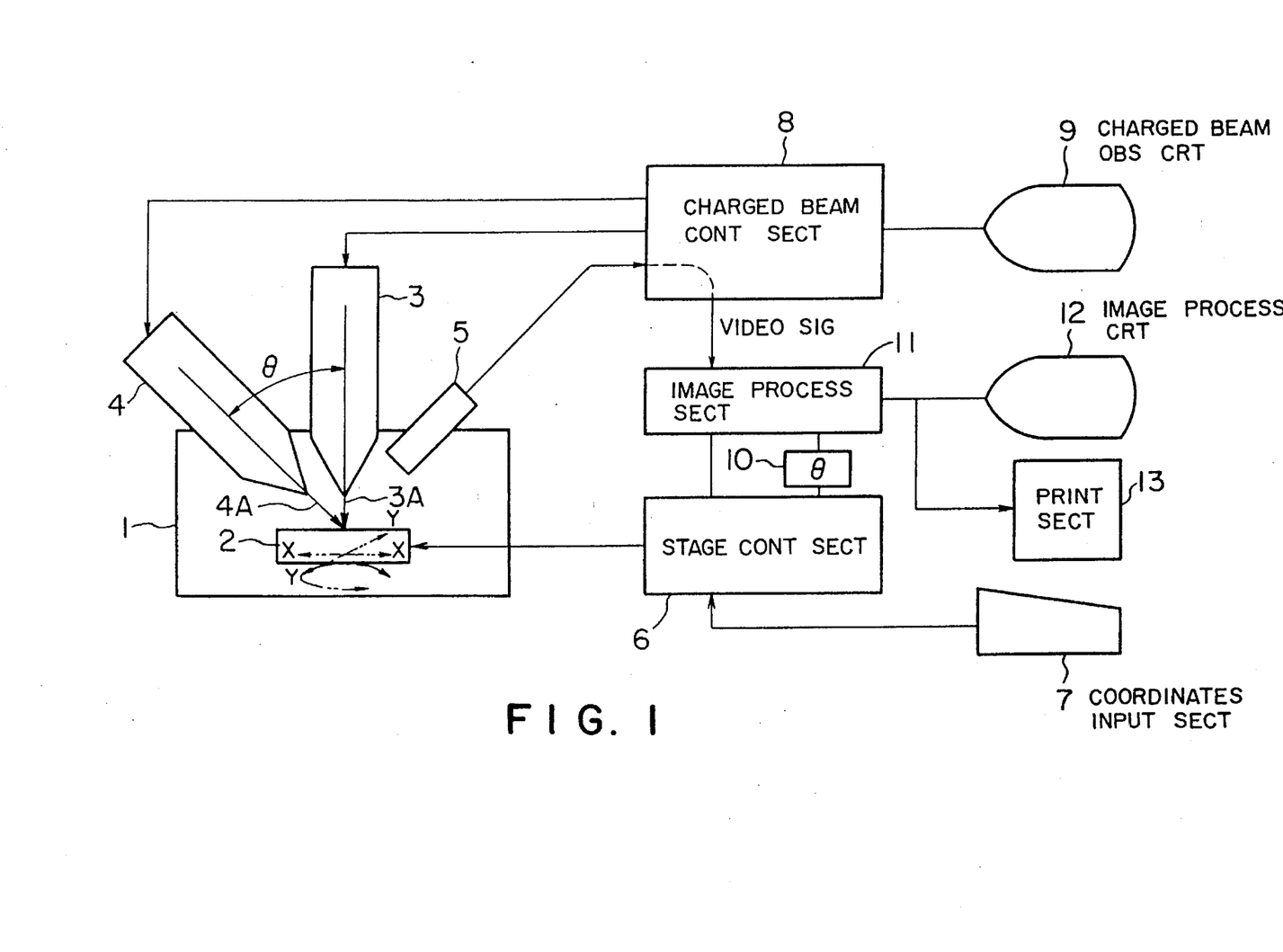
FIG. 1 is a schematic bock diagram showing a first embodiment of the substrate cross section observing apparatus according to the present invention.

FIG. 1 shows a first embodiment thereof. In the drawing, within a vacuum chamber 1, there are arranged a stage for mounting a wafer to be observed, an ion beam irradiating unit 3 for forming an observation cross section, an observing electron beam irradiating unit 4, and a detector 5 for detecting secondary electrons (emitted from the substrate due to irradiation of the observing electron beam) to generate video signals VS.

As shown in FIG. 1, the stage 2 can be moved in two axial (X-axis and Y-axis) directions in a horizontal plane and further can be rotated around an origin of two coordinate axes (at which the two coordinate axes intersect each other).

The ion beam irradiating unit 3 is so disposed at to irradiate an ion beam 3A at a right angle upon the surface of the observed wafer mounted on the stage 2. Further, the electron beam irradiating unit 4 is so disposed as to irradiate an electron beam 4A at an inclination angle θ upon the surface of the observed wafer mounted on the stage 2. That is, the electron beam irradiating unit 4 is disposed being inclined by an angle θ with respect to the ion beam irradiating unit 3.

Further, the substrate cross section observing apparatus comprises other units and sections as follows: a stage control section 6 receives coordinate data supplied by a coordinate input section 7, and moves the stage 2 to a coordinate data position on the basis of the input coordinate data. To this coordinate input section 7, coordinate data indicative of observation locations (at which the wafer mounted on the stage 2 is to be observed) are inputted on the basis of CAD (computer aided design), for instance.

A charged beam control section 8 controls the intensities of both the beams generated by the ion beam irradiating unit 3 and the electron beam irradiating unit 4, and further receives the video signals VS generated by the detector 5. Further, to this charged beam control section 8, a charged beam observing CRT (cathode ray tube) 9 is connected.

An inclination angle signal generating section (Θ) 10 supplies an inclination angle signal indicative of an inclination angle θ (between the electron beam of the electron beam irradiating unit 4 and the normal line perpendicular to the surface of the observed wafer) to an image processing section 11. Further, to this image processing section 11, the video signals VS generated by the detector 5 are also transmitted via the charged beam control section 8. Therefore, the video signals VS can be corrected on the basis of the inclination signal θ generated by the inclination angle signal generating section 10.

An image processing CRT 12 displays both the original video signals VS given by the image processing section 10 and the above-mentioned corrected video signals VS, respectively.

A printing unit 13 prints the corrected video signals VS given by the image processing section 11.

The operation of the first embodiment of the present invention will be described hereinbelow.

Figure 2:
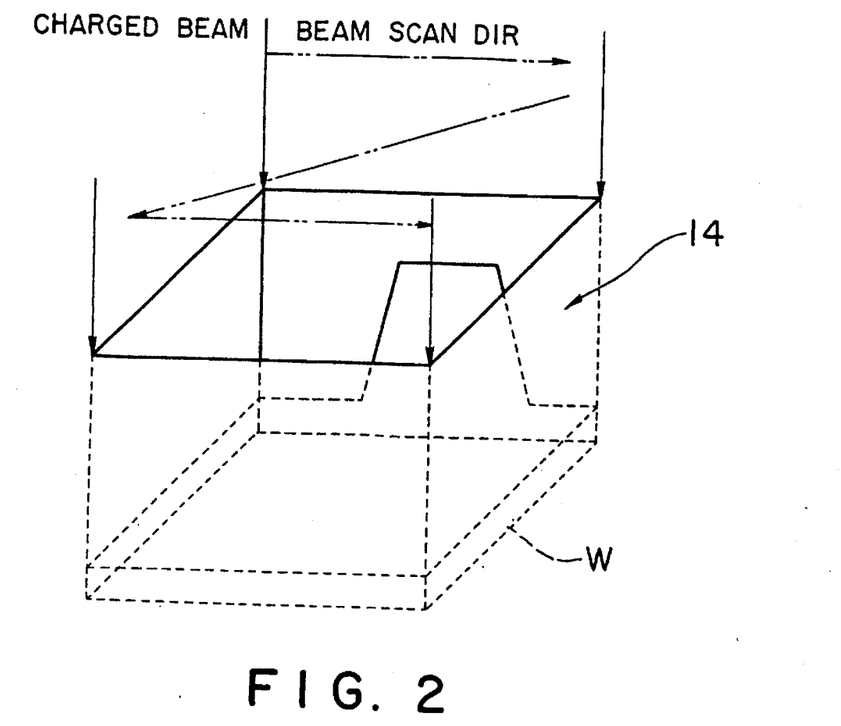
FIG. 2 is a perspective view showing an example of processed observation cross section, in which the observation cross section is buried in a wafer.

The state control section 6 moves the stage 2 to an observation coordinate position in accordance with the coordinate data supplied by the coordinate input section 7 in such a way that the microminiaturized pattern portion to be observed in the surface of the wafer can be located just under the ion beam irradiating unit 3. Under these conditions, on the basis of a command of the charged beam control section 8, the ion beam irradiating unit 3 irradiates an ion beam 3A upon the surface of the observed wafer mounted on the stage 2 at a right angle, in order that a vertical bore can be formed by etching the surface of the observed wafer. In more detail, as depicted in FIG. 2, the ion beam irradiating unit 3 irradiates the ion beam 3A upon the wafer W by scanning the ion beam 3A in two dimensional directions to form a vertical bore of a predetermined size, so that an observation cross section 14 can be formed in the wall surface of this formed vertical bore.

Figure 3:
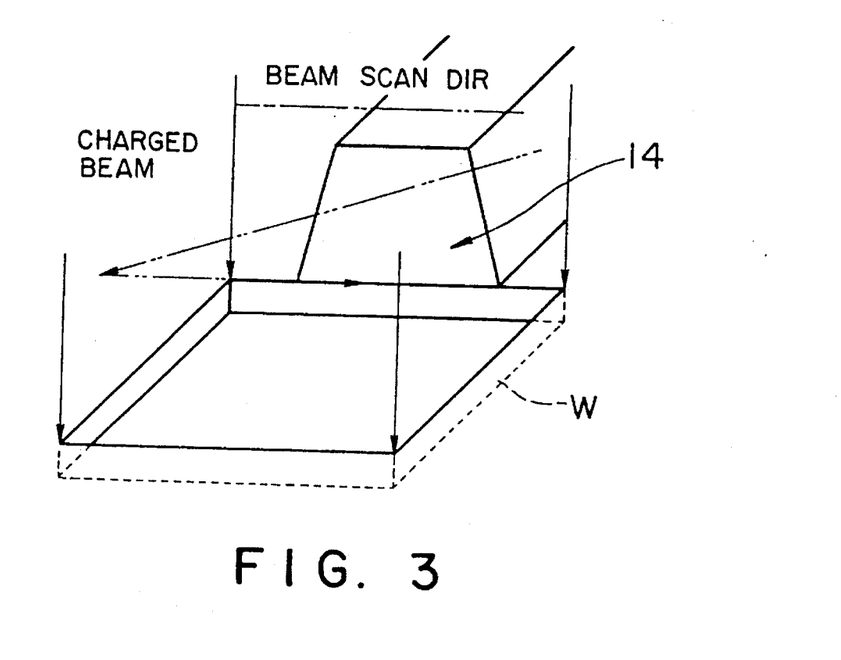
FIG. 3 is a perspective view showing an example of processed observation cross section, in which the observation cross section is located at an end surface of the rough surface of the wafer.

In the above-mentioned example, since the observation cross section 14 is located inside the wafer W, the vertical bore is formed to obtain the observation cross section 14. However, as shown in FIG. 3, when an observation cross section 14 is required to be formed on the end surface of the minute rough surface of the wafer W, the end surface of the minute rough surface is removed by etching, instead of forming a vertical bore.

After the observation cross section 14 has been formed in the surface of the wafer W, the stage control section 6 moves the stage 2 on the basis of the coordinate data supplied by the coordinate input section 7, so that the electron beam 4A of the electron beam irradiating unit 3 can be irradiated upon the observation cross section 14. In addition, the stage 2 is rotated so that the irradiation direction of the electron beam 4A becomes perpendicular to the observation cross section 14 when seen from above.

Figure 4A:
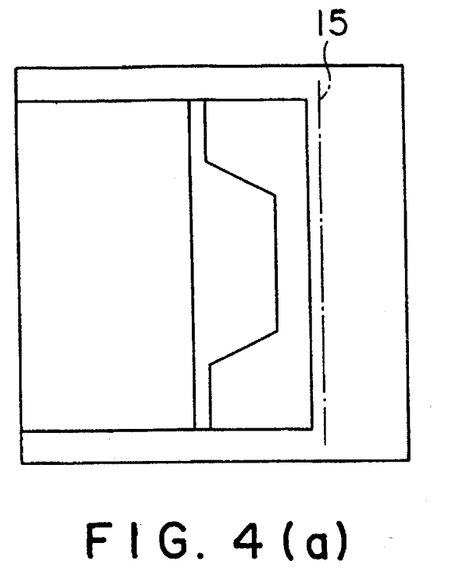
FIG. 4(a) is a view showing an observation image obtained when observed obliquely from above.
Figure 5A:
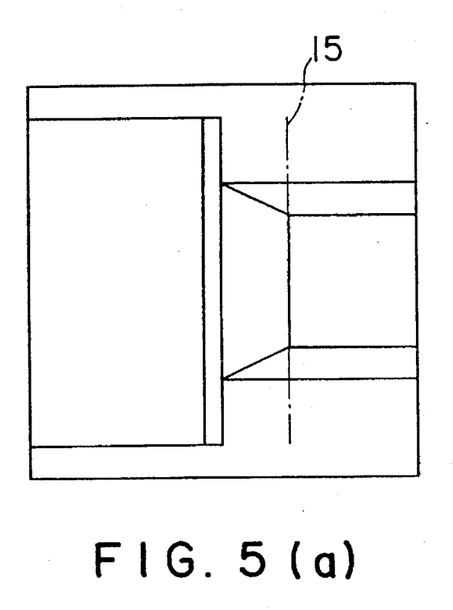
FIG. 5(a) is another view showing an observation image obtained when observed obliquely from above.

Under these conditions, the electron beam irradiating unit 4 irradiates the electron beam 4A upon the observation cross section 14 obliquely from above by scanning the electron beam 4A in two dimensional directions all over the surface of the observation cross section 14. The detector 5 detects the secondary electrons emitted from the observation cross section 14 and generates video signals VS. The video signals VS obtained when the observation cross section 14 is observed obliquely from above are transmitted to the image processing CRT 12 via the charged beam control section 8 and the image processing section 11, and then displayed on the image processing CRT 12. FIGS. 4(a) and 5(a) show images obtained when the observation cross section 14 is observed obliquely from above, respectively. Here, a coordinate transform axis 15 is matched with a top edge of the observation cross section displayed on the image processing CRT 12.

The image processing section 11 transforms a distance l between the coordinate transform axis 15 and each pixel into a distance L in accordance with the following formula; that is, the distance l is affine-transformed by (1/sin θ)-times onto the coordinate transformation axis 16 only in the vertical direction as follows:

$$L = l \times (1/\sin\theta)$$

Here, this transformation is made under the conditions that the density values at the respective pixels are maintained as they are. Owing to the affine-transformation as described above, an image of the observation cross section observed obliquely from above can be transformed into an image of the observation cross section observed vertically from above, and the transformed image is displayed on the image processing CRT 12.

Figure 4B:
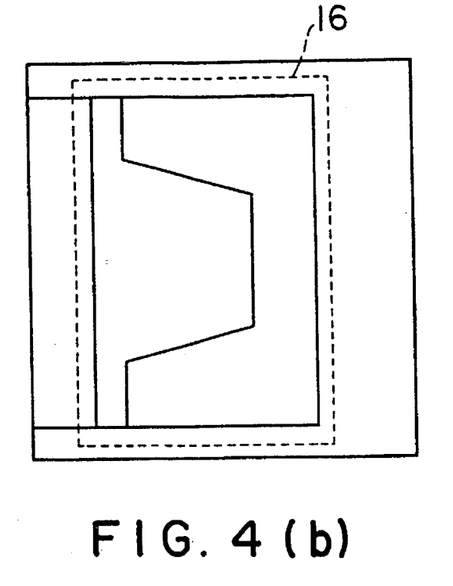
FIG. 4(b) is a view showing an observation image obtained when an image observed obliquely from above is corrected on the basis of an inclination angle θ.
Figure 5B:
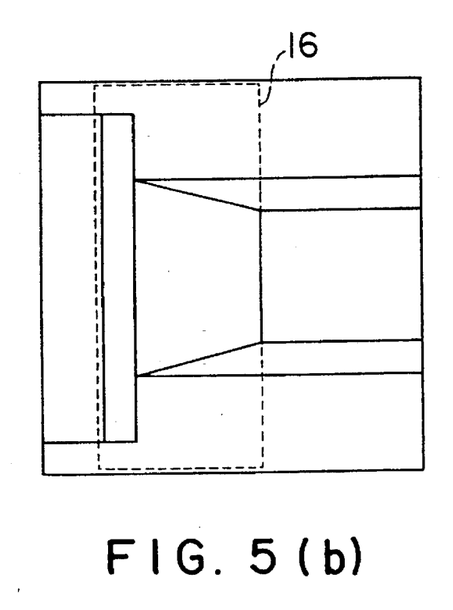
FIG. 5(b) is another view showing an observation image obtained when an image observed obliquely from above is corrected on the basis of an inclination angle θ.

FIGS. 4(b) and 5(b) show the transformed images. The printing unit 13 extracts the areas enclosed by the dashed lines 16 in FIGS. 4(b) and 5(b) and prints the image of the transformed observation cross sections 14.

As described above, in the first embodiment, in spite of the fact that the electron beam irradiating unit 4 irradiates the electron beam 4A upon the surface of the observed wafer at a predetermined inclination angle θ, the image processing section 11 corrects the image of the observation cross section on the basis of the inclination angle θ; that is, the image obtained when seen obliquely from above can be transformed into the image obtained when seen vertically from above. Accordingly, it is possible to determine the vertical dimension (depth) of the observation cross section intuitively on the basis of the image information outputted by the printing unit 13.

Figure 6:
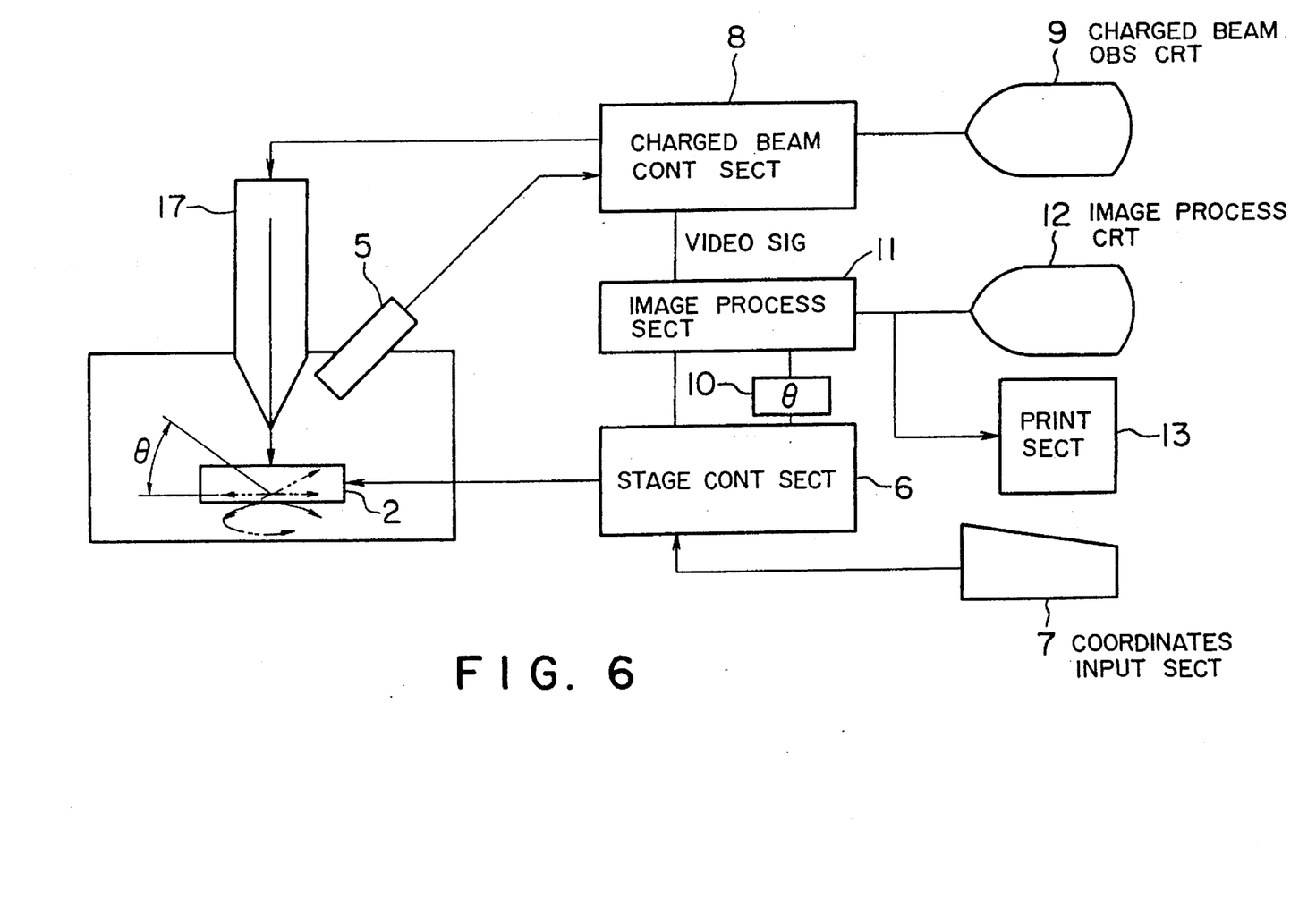
FIG. 6 is a schematic bock diagram showing a second embodiment of the substrate cross section observing apparatus according to the present invention.

FIG. 6 shows a second embodiment of the present invention. In the same way as with the case of the first embodiment, the stage 2 is movable in the two dimensional directions and further rotatable. In addition, this stage 2 is so constructed as to be inclinable. A charged beam irradiating unit 17 used in common for processing and observation can generate a processing charged beam of a high beam intensity and an observing charged beam of a low beam intensity, respectively. The construction other than the above is basically the same as with the case of the first embodiment.

The stage control section 6 moves the stage 2 in two dimensional directions on the basis of the coordinate data supplied by the coordinate input section 7, and further inclines the stage 2, so that the surface of the observed wafer W is positioned in a direction perpendicular to the charged beam of the charged beam irradiating unit 17.

Under these conditions, when charged beam irradiating unit 17 irradiates the charged beam upon the surface of the observed wafer vertically to form an observation cross section.

After that, in the same way in the first embodiment, the stage 2 is rotated so that the observing charged beam of the charged beam irradiating unit 17 is directed to the observation cross section. In addition, the stage 2 is further inclined by a predetermined inclination angle θ so that the observing charged beam can be irradiated upon the surface of the observed wafer at the inclination angle θ. Further, this inclination angle θ is inputted to the inclination angle signal generating section 11. Under these conditions, singe the observing charged beam of the charged beam irradiating unit 17 is irradiated upon the observation cross section obliquely from above, the detector 5 detects the secondary electrons emitted there-from and generates the video signals VS, in the same way as with the case of the first embodiment.

Figure 7:
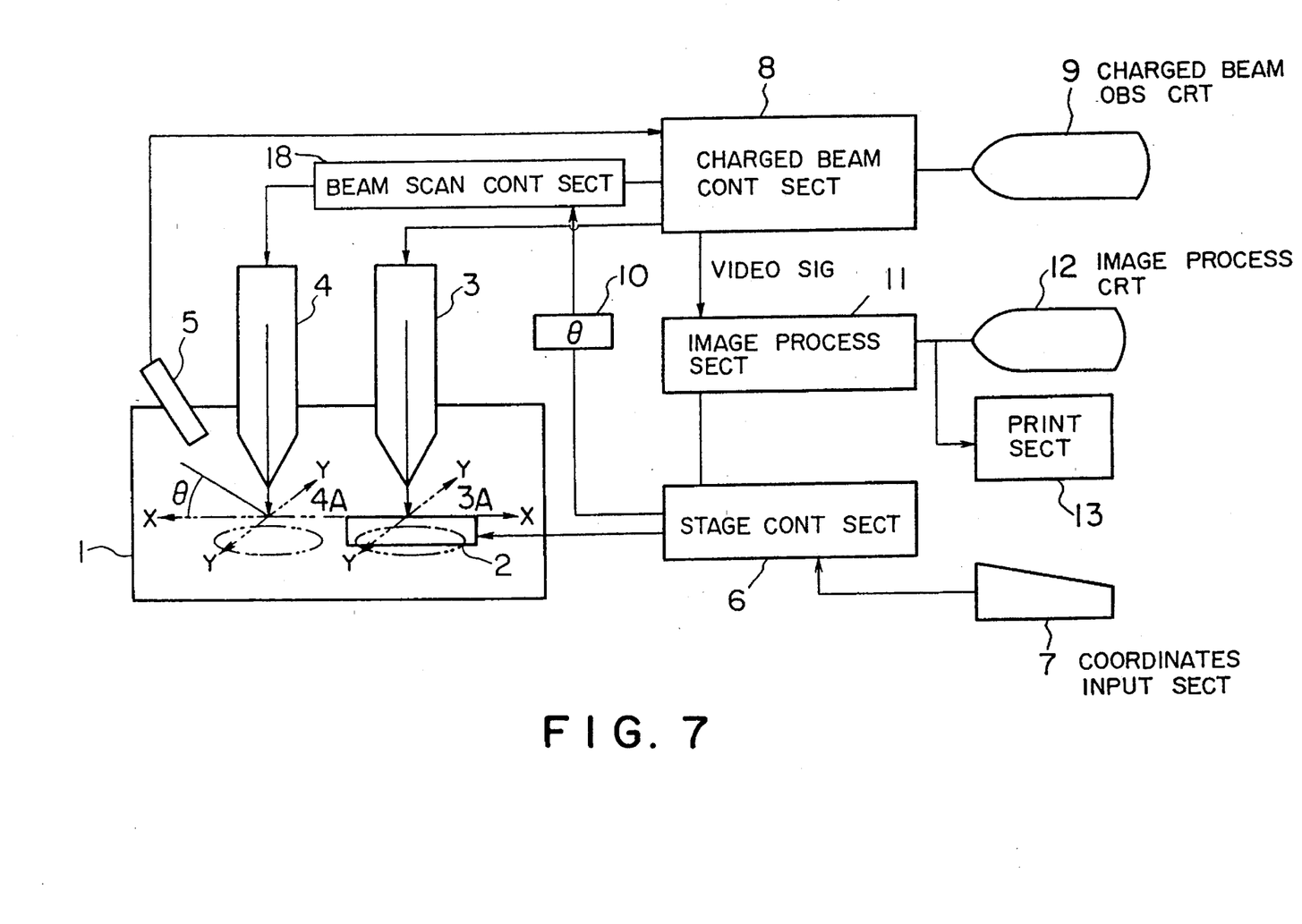
FIG. 7 is a schematic bock diagram showing a third embodiment of the substrate cross section observing apparatus according to the present invention.

FIG. 7 shows a third embodiment of the present invention. In the drawing, within a vacuum chamber 1, there are arranged a stage for mounting a wafer to be observed, an ion beam irradiating unit 3 for forming an observation cross section, an observing electron beam irradiating unit 4, and a detector 5 for detecting secondary electrons to generate video signals VS, respectively.

As shown by dashed arrows in FIG. 7, the stage 2 can be moved in two axial (X-axis and Y-axis) directions in a horizontal plane and further can be rotated around an origin of two coordinate axes (at which the two (X and Y) axes intersect each other). In addition, the stage 2 can be inclined around the Y—Y axis by any given inclination angle Θ. Further, the beam axes of both the ion beam irradiating unit 3 and the electron beam irradiating unit 4 are so arranged as to become perpendicular to the surface of the observed wafer in parallel to each other at a distance apart from each other.

Accordingly, the ion beam 3A of the ion beam irradiating unit 3 is irradiated at a right angle upon the stage 2 (whose inclination angle Θ is set to zero (Θ=0) for processing a bore. On the other hand, the electron beam 4A of the electron beam irradiating unit 4 is irradiated at an inclination angle θ upon the stage 2 (whose inclination angle θ is set to a predetermined value Θ) for observing the formed bore.

To a stage control section 6, coordinate data are supplied by a coordinate input section 7, so that the stage 2 can be moved to a coordinate data position on the basis of the input coordinate data. To this coordinate input section 7, coordinate data indicative of a position at which the observed wafer mounted on the stage 2 is to be observed are inputted on the basis of CAD (computer aided design), for instance.

The ion beam irradiating unit 3 and the electron beam irradiating unit 4 are both connected to the charged beam control section 8. The output side of the charged beam control section 8 is connected to a charged beam observing CRT 9. The intensities of the beams of the ion beam irradiating unit 3 and the electron beam irradiating unit 4 are both controlled by drive signals outputted by the charged beam control section 8.

Further, a beam scanning control section 18 is interconnected between the charged beam irradiating unit 4 and the charged beam control section 8. This beam scanning control section 18 receives an inclination angle Θ of the stage 2 from the inclination angle signal generating section (Θ) 10.

The video signals VS of detector 5 are inputted to the image processing section 11 via the charged beam control section 8. The output side of the image processing section 11 is connected to an image processing CRT 12 and a printing unit 13, respectively.

The operation of the third embodiment of the present invention will be described hereinbelow.

Figure 8:
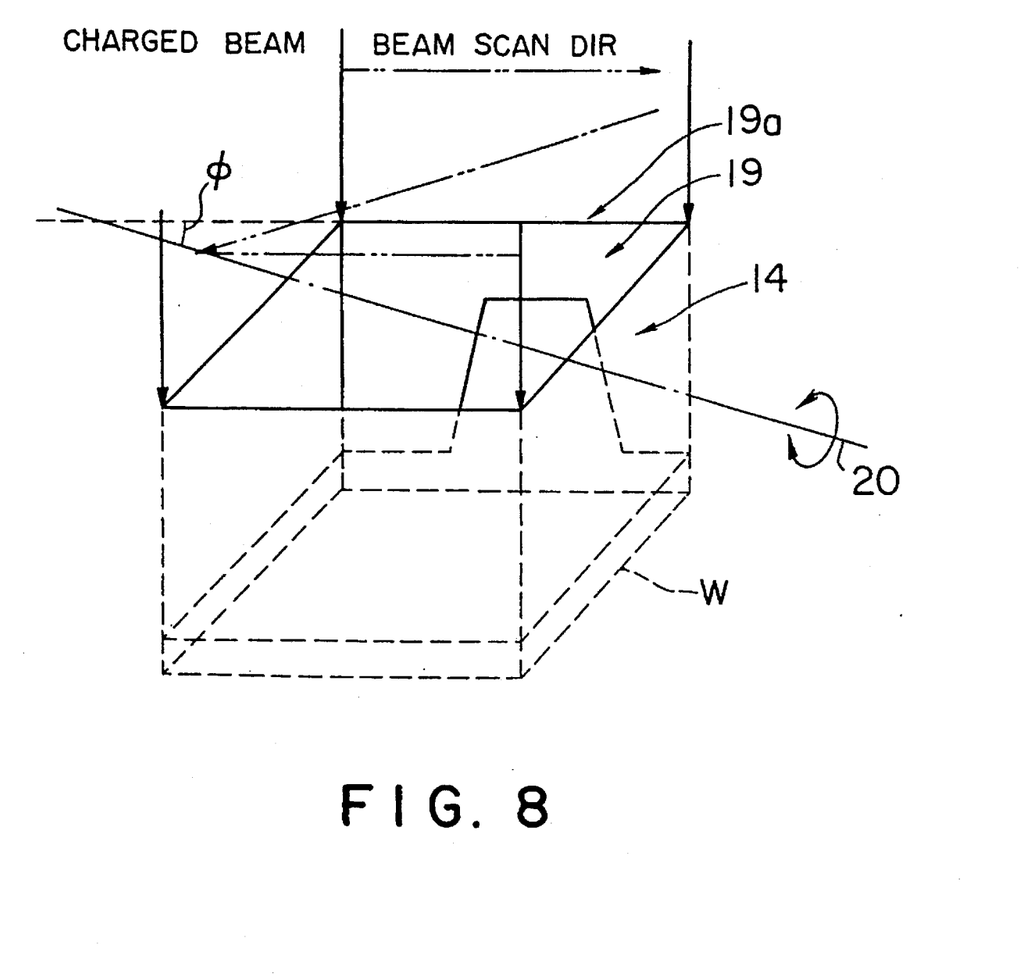
FIG. 8 is a perspective view showing another example of processed observation cross section, in which the observation cross section is buried in a wafer.

The state control section 6 moves the stage 2 at a coordinate position in accordance with the coordinate data supplied by the coordinate input section 7 in such a way that the microminiaturized pattern portion to be observed in the surface of the wafer can be located just under the ion beam irradiating unit 3. Under these conditions, on the basis of a command of the charged beam control section 8, the ion beam irradiating unit 3 irradiates an ion beam 3A upon the surface of the observed wafer mounted on the stage 2 at a right angle, in order that a vertical rectangular bore 19 can be formed on the surface of the observed wafer by etching. In more detail, as depicted in FIG. 8, the ion beam irradiating unit 3 irradiates the ion beam 3A upon the wafer W by scanning the same beam 3A in two dimensional directions, so that the vertical rectangular bore 19 of a predetermined size can be formed, that is, an observation cross section 14 can be formed on the wall surface of this formed vertical rectangular bore 19.

After the vertical observation cross section 14 has been formed on the surface of the wafer W, the stage control section 6 further moves the state 2 so that the formed vertical rectangular bore 19 can be located just under the electron beam irradiating unit 4.

Under these conditions, on the basis of the command of the charged beam control section 8, the electron beam irradiating unit 4 irradiates the electron beam 4A at a right angle upon the surface of the observed wafer W mounted on the stage 2. The detector 4 detects an image of the secondary electrons emitted from the rectangular bore 19, and generates video signals VS corresponding thereto. The video signals VS obtained when the rectangular bore 19 is observed are transmitted to the image processing section 11 via the charged beam control section 8, and then displayed on the image processing CRT 12.

Figure 9A:
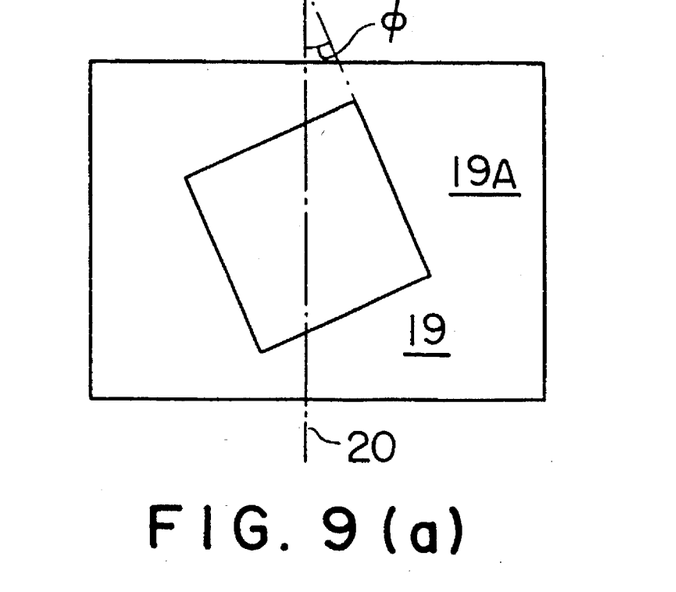
FIG. 9(a) is an observation image obtained when a rectangular observation process bore is observed.
Figure 9B:
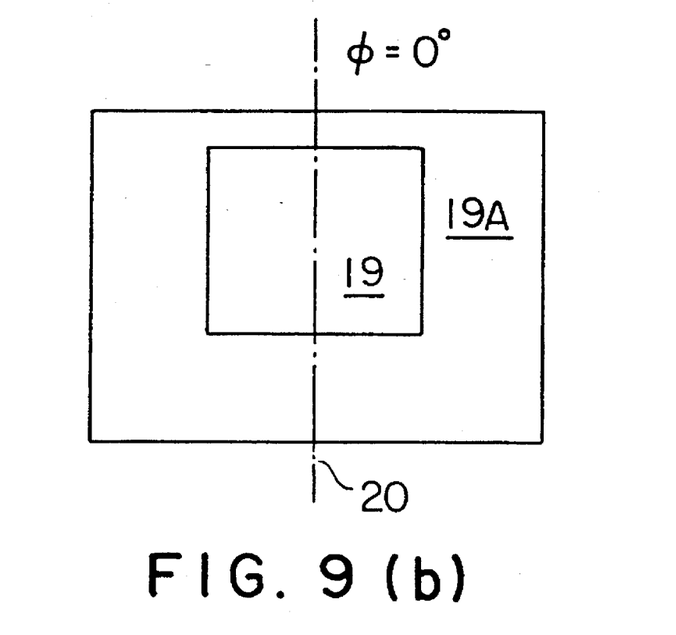
FIG. 9(b) is an observation image obtained when an top edge and a stage inclination axis both match each other.

FIG. 9(a) shows an image obtained when the rectangular bore 19 is observed as described above. Further, the image processing section 11 detects the contour of the rectangular bore 19, selects a side 19A of the observation cross section, and further detects a difference angle φ between the top edge 19A of the observation cross section image and the inclination axis. This difference angle φ is transmitted to the stage control section 6 and the charged beam control unit 8 in order to match the top edge 19A with the stage inclination axis 20, as shown in FIG. 9(b).

Under these conditions, the stage control section 6 inclines the stage 2 by a predetermined inclination angle Θ. At this time, the inclination angle signal between the wafer surface and the observing electron beam is transmitted from the inclination angle signal generating section 10 to the beam scanning control section 18.

The beam scanning control section 18 generates a scanning signal in such a way that when d denotes the scanning distance at the inclination angle Θ=0, the scanning distance L at the inclination angle Θ becomes as follows:

$$L = d \times \sin\Theta$$

That is, the beam scanning control section 18 transmits the scanning signal to the observing charged beam irradiating unit 4 in such a way that the observing charged beam can be irradiated along the horizontal direction of the observation cross section at the scanning intervals d, but along the depth direction of thereof at the scanning intervals (L=d×sinΘ). As described above, the observing electron beam 4A of the electron beam irradiating unit 4 can be irradiated upon the observation cross section obliquely from above. In this case, the electron beam 4A is scanned in the two dimensional directions all over the surface of the observation cross section 14. The detector 5 detects the secondary electrons emitted from the observation cross section 14 and generates the video signals VS. The video signals VS obtained when the observation cross section 14 is observed obliquely from above are transmitted to the image processing section 11 via the charged beam control section 8.

In this image processing section 11, the video signals VS are recorded in a frame memory for transforming images in the simultaneous time series sequence, irrespective of the surface direction and the depth direction, and further displayed on the image processing CRT 12.

Figure 10:
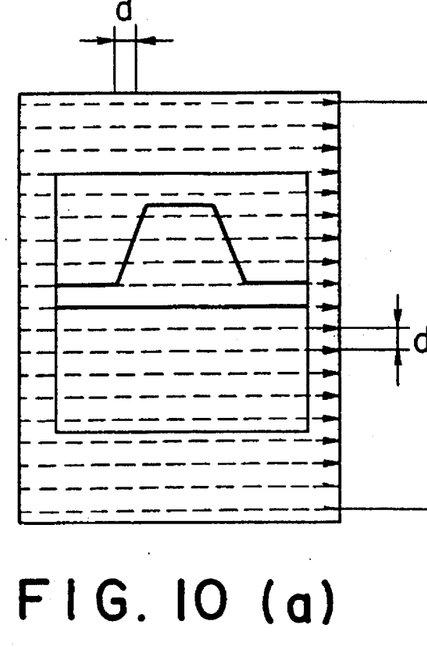
FIG. 10(a) is an illustration obtained at the ordinary (prior art) scanning operation.
FIG. 10(b) is an illustration for assistance in explaining a status where video signals are stored in sequence at respective addresses of a frame memory of the image processing apparatus.

FIG. 10(a) shows the scanning of the ordinary (prior art) method, and FIG. 10(b) shows the status where the video signals VS are stored in sequence at the respective addresses of the frame memory of the image processing section 11. In this prior art method, the image signals are inputted to the frame memory under the conditions that the scanning intervals d is the same in both the vertical and horizontal directions.

Figure 11:
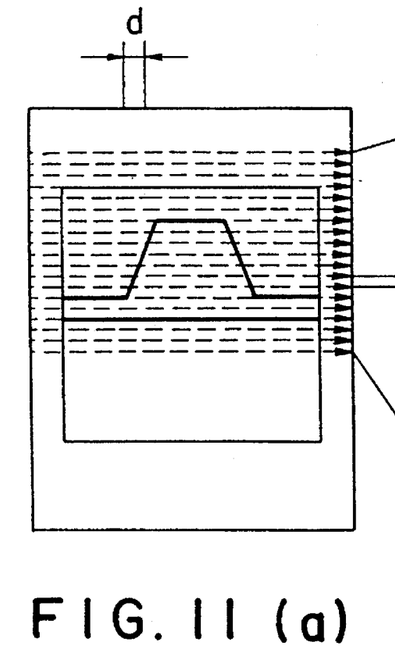
FIG. 11(a) is an illustration showing an example of video signals obtained at the scanning operation according to the present invention.
FIG. 11(b) is an illustration for assistance in explaining a status where video signals are stored in sequence at respective addresses of the frame memory of the image processing apparatus.

In contrast with the prior art method as shown in FIGS. 10(a) and 10(b), FIG. 11(a) shows the scanning method according to the present invention, and FIG. 11(b) shows status where the video signals VS are stored in sequence at the respective addresses of the frame memory of the image processing section 11. In the method of the present invention, the electron beam 4A is irradiated in such a way that the scanning intervals in the horizontal direction becomes d, but the scanning intervals in the vertical direction becomes L=d×sinΘ. In other words, the charged beam is irradiated in the vertical direction at intervals shorter than those of the ordinary scanning pitch. On the other hand, however, since the video signals VS are stored in sequence at the intervals d (which is the same as those of the ordinary scanning) at the respective addresses of the frame memory, it is possible to transform the video signals VS obtained when the observation cross section 14 is observed obliquely from above into an image obtained when observed vertically from above. The video signals VS thus transformed are displayed on the image processing CRT 12.

As described above, in the substrate cross section observing apparatus according to the present invention, since the observing charged beam is irradiated upon the observed surface obliquely from above to obtain an image of observation cross section, since the video signals of the observation cross section obtained when observed obliquely from above are corrected on the basis of the inclination angle signal, and since the image of the observation cross section is displayed on the basis of the corrected video signals, if the observing charged beam is irradiated upon the observation cross section obliquely from above, it is possible to obtain the observation image equivalent to that obtained when the observing charged beam is irradiated upon the surface vertically from above. In addition, since it is unnecessary to incline the stage at a large inclination angle, it is unnecessary to etch the observed wafer over a wide surface area, so that the processing time can be reduced.

What is claimed is:

1. A substrate cross section observing apparatus, comprising:

stage means for mounting a substrate to be observed;

a first charged beam irradiating means for irradiating a processing charged beam at roughly a right angle upon a surface of the substrate, to form an almost vertical observation surface therein;

a second charged beam irradiating means being inclined relative to the first charged beam irradiating means, for irradiating an observing charged beam at a predetermined inclination angle upon the formed observation surface of the substrate;

detecting means for detecting secondary electrons generated by the irradiation of the observing charged beam, and for generating video signals;

inclination angle signal generating means for generating an inclination angle signal indicative of the predetermined inclination angle;

image processing means for correcting the image signals generated by said detecting means on the basis of the inclination angle signal generated by said inclination angle signal generating means; and display means for displaying an image of the observation surface on the basis of the corrected image signals.

2. The substrate cross section observing apparatus of claim 1, which further comprises:

coordinate inputting means for inputting two dimensional coordinates of said stage means; and stage control means for moving said stage means to a processing charged beam irradiating position and an observing charged beam irradiation position, respectively on the basis of the two dimensional position coordinates.

3. A substrate cross section observing apparatus, comprising:

inclinable stage means for mounting a substrate to be observed;

charged beam irradiating means for irradiating a processing charged beam at roughly a right angle upon a surface of the substrate to form an almost vertical observation surface therein and further, after the observation surface has been formed, for irradiating an observing charged beam at a predetermined inclination angle upon the formed observation surface of the substrate;

detecting means for detecting secondary electrons generated by the irradiation of the observing charged beam, and for generating video signals;

inclination angle signal generating means for generating an inclination angle signal indicative of the predetermined inclination angle between the wafer surface and the observing charged beam;

image processing means for correcting the image signals generated by said detecting means on the basis of the inclination angle signal generated by said inclination angle signal generating means;

display means for displaying an image of the observation surface on the basis of the corrected image signals; and wherein the inclination angle of said stage means is changed between the processing charged beam irradiation and the observing charged beam irradiation.

4. The substrate cross section observing apparatus of claim 3, which further comprises:

coordinate inputting means for inputting two dimensional coordinates of said stage means; and stage control means for moving said stage means to a processing charged beam irradiating position and an observing charged beam irradiation position, respectively on the basis of the two dimensional position coordinates.

5. A substrate cross section observing apparatus, comprising:

inclinable stage means for mounting a substrate to be observed;

a first charged beam irradiating means for irradiating a processing charged beam at roughly a right angle upon a surface of the substrate mounted on said inclinable stage means, to form an almost vertical observation surface therein;

a second charged beam irradiating means, after the observation surface has been formed, for irradiating an observing charged beam at a predetermined inclination angle upon the surface of the formed observation surface;

detecting means for detecting secondary electrons generated by the irradiation of the observing charged beam, and for generating video signals;

inclination angle signal generating means for generating an inclination angle signal indicative of the predetermined inclination angle between the wafer surface and the observing charged beam;

beam scanning control means for controlling a scanning speed or a scanning pitch of the observing charged beam on the basis of the inclination angle signal generated by said inclination angle signal generating means; and display means for displaying an image of the observation surface.

6. A method of observing a substrate cross section, which comprises of the steps of:

holding a wafer on a stage;

irradiating a processing charged beam at roughly a right angle upon a surface of the wafer to form a vertical observation cross section in an observed portion of the wafer;

inclining the stage at such an inclination angle that an observing charged beam can be irradiated upon the observation cross section;

detecting an inclination angle signal indicative of an inclination angle between the wafer surface and the observing charged beam;

generating a beam scanning signal for controlling a scanning speed or a scanning pitch of the observing charged beam on the basis of the detected inclination angle signal;

irradiating an observing charged beam upon the observation cross section at a magnification-dependent scanning speed or pitch in the surface direction and at the beam scanning signal-dependent scanning speed or pitch in a surface depth direction;

converting secondary electrons generated by the irradiation of the observing charged beam into image through a detector; and displaying the converted image on a display unit.

* * * * *